US012625530B2

(12) United States Patent
Fidan et al.

(10) Patent No.: US 12,625,530 B2
(45) Date of Patent: May 12, 2026

(54) FULLY INTEGRATED QUANTUM COMPUTER

(71) Applicant: ANYON SYSTEMS INC., Dorval (CA)

(72) Inventors: Umut Fidan, Laval (CA); Alireza Najafi-Yazdi, Vaudreuil-Dorion (CA); Justin Huneault, Montréal (CA); Ramak Radmard, Beaconsfield (CA)

(73) Assignee: ANYON SYSTEMS INC., Dorval (CA)

( * ) Notice: Subject to any disclaimer, the term of this patent is extended or adjusted under 35 U.S.C. 154(b) by 84 days.

(21) Appl. No.: 18/844,104

(22) PCT Filed: Mar. 7, 2023

(86) PCT No.: PCT/CA2023/050292
§ 371 (c)(1),
(2) Date: Sep. 5, 2024

(87) PCT Pub. No.: WO2023/168516
PCT Pub. Date: Sep. 14, 2023

(65) Prior Publication Data
US 2025/0190034 A1     Jun. 12, 2025

Related U.S. Application Data

(60) Provisional application No. 63/317,493, filed on Mar. 7, 2022.

(51) Int. Cl.
G06F 1/183     (2026.01)
G06F 1/20     (2006.01)
(Continued)

(52) U.S. Cl.
CPC ................ G06F 1/183 (2013.01); G06F 1/20 (2013.01); G06N 10/00 (2019.01); H05K 7/1488 (2013.01);
(Continued)

(58) Field of Classification Search
CPC .. H05K 7/1485; H05K 7/1488; H05K 7/1489; H05K 7/1497; H05K 7/16;
(Continued)

(56) References Cited

U.S. PATENT DOCUMENTS 5,443,312 A * 8/1995 Schluter ............... H05K 7/1488
312/246
6,980,427 B2 12/2005 Garnett et al.
(Continued)

OTHER PUBLICATIONS

IBM Unveils World's First Integrated Quantum Computing System for Commercial Use (IBM Newsletter), pp. 1-3, Jan. 8, 2019 (Aug. 1, 2019), retrieved from https://newsroom.ibm.com/2019-01-08-IBM-Unveils-Worlds-First-Integrated-Quantum-Computing-System-for•Commercial-Use.

*Primary Examiner* — Patrick F Marinelli
(74) *Attorney, Agent, or Firm* — NORTON ROSE FULBRIGHT CANADA LLP

(57) ABSTRACT

There is described herein a quantum computer and a structure for housing a quantum computer. The quantum computer comprises an outer frame defining an outer periphery that surrounds an interior volume, the outer frame having a top end, a bottom end, and a plurality of sides extending between the top end and the bottom end. A plurality of sub-frames are mounted to the outer frame within the outer periphery, the sub-frames disposed within the interior volume. Quantum hardware is mounted to the sub-frames, each of the sub-frames having a subset of the quantum hardware mounted thereto, the quantum hardware comprising cryostat
(Continued)

components, gas handling components, control electronics components and servicing components.

20 Claims, 17 Drawing Sheets

(51) Int. Cl.
    *G06N 10/00*        (2022.01)
    *H05K 7/14*         (2006.01)
    *H05K 7/18*         (2006.01)
    *H05K 7/20*         (2006.01)

(52) U.S. Cl.
    CPC ......... *H05K 7/183* (2013.01); *H05K 7/20372*
           (2013.01); *H05K 7/1489* (2013.01)

(58) Field of Classification Search
    CPC ...... H05K 7/18; H05K 7/183; H05K 7/20372;
                              G06N 10/00
    See application file for complete search history.

(56)           References Cited

U.S. PATENT DOCUMENTS

| | | | | |
|---|---|---|---|---|
| 8,472,181 | B2 | 6/2013 | Doll | |
| 8,607,996 | B2 * | 12/2013 | Yang | H05K 7/1488 |
| | | | | 312/201 |
| 9,185,828 | B2 | 11/2015 | Knudsen et al. | |
| 9,723,922 | B2 * | 8/2017 | Chen | A47B 88/956 |
| 10,969,842 | B2 | 4/2021 | Enright et al. | |
| 11,064,627 | B2 | 7/2021 | Wilke | |
| 11,122,892 | B2 | 9/2021 | Chen et al. | |
| 11,160,371 | B2 | 11/2021 | Chen et al. | |
| 11,291,301 | B2 | 4/2022 | Bova et al. | |
| 11,299,321 | B2 | 4/2022 | Vaeth | |
| 11,363,883 | B2 | 6/2022 | Lert et al. | |
| 11,388,836 | B2 | 7/2022 | Curlee et al. | |
| 11,423,322 | B2 * | 8/2022 | Leipold | G06N 10/40 |
| 11,480,299 | B1 * | 10/2022 | Najafi-Yazdi | F17C 13/007 |
| D1,031,721 | S * | 6/2024 | Radmard | D14/301 |
| 12,079,690 | B2 * | 9/2024 | Jones | G06F 1/20 |
| 12,320,557 | B2 * | 6/2025 | Jiang | F25B 19/005 |
| D1,085,075 | S * | 7/2025 | Najafi-Yazdi | D14/308 |
| D1,095,523 | S * | 9/2025 | Wang | D14/314 |
| 12,416,950 | B2 * | 9/2025 | Schiff | G06F 1/20 |
| 12,504,596 | B2 * | 12/2025 | Bryon | G02B 6/4477 |
| 2014/0301037 | A1 | 10/2014 | Best | |
| 2016/0165761 | A1 | 6/2016 | Cox et al. | |
| 2017/0311479 | A1 | 10/2017 | Barragy et al. | |
| 2019/0045653 | A1 * | 2/2019 | Koo | H02B 1/34 |
| 2020/0163470 | A1 * | 5/2020 | Chen | A47F 5/0093 |
| 2021/0350270 | A1 * | 11/2021 | Jones | G06F 1/20 |
| 2022/0400574 | A1 * | 12/2022 | Keegan | H05K 7/1497 |
| 2024/0344743 | A1 * | 10/2024 | Jiang | F25B 19/005 |
| 2025/0005413 | A1 * | 1/2025 | Hall | G06N 10/40 |
| 2025/0190034 | A1 * | 6/2025 | Fidan | G06F 1/20 |
| 2025/0194051 | A1 * | 6/2025 | Hall | F25D 19/006 |
| 2025/0294704 | A1 * | 9/2025 | Hu | G06F 1/20 |

* cited by examiner 202
202B
208
202C
W1
W2
L1
209A
L2
202A
202D

$\overline{F_{\boxminus}}.4$

114

104

602

604

112

302

104

706

702

704

_FIG_7

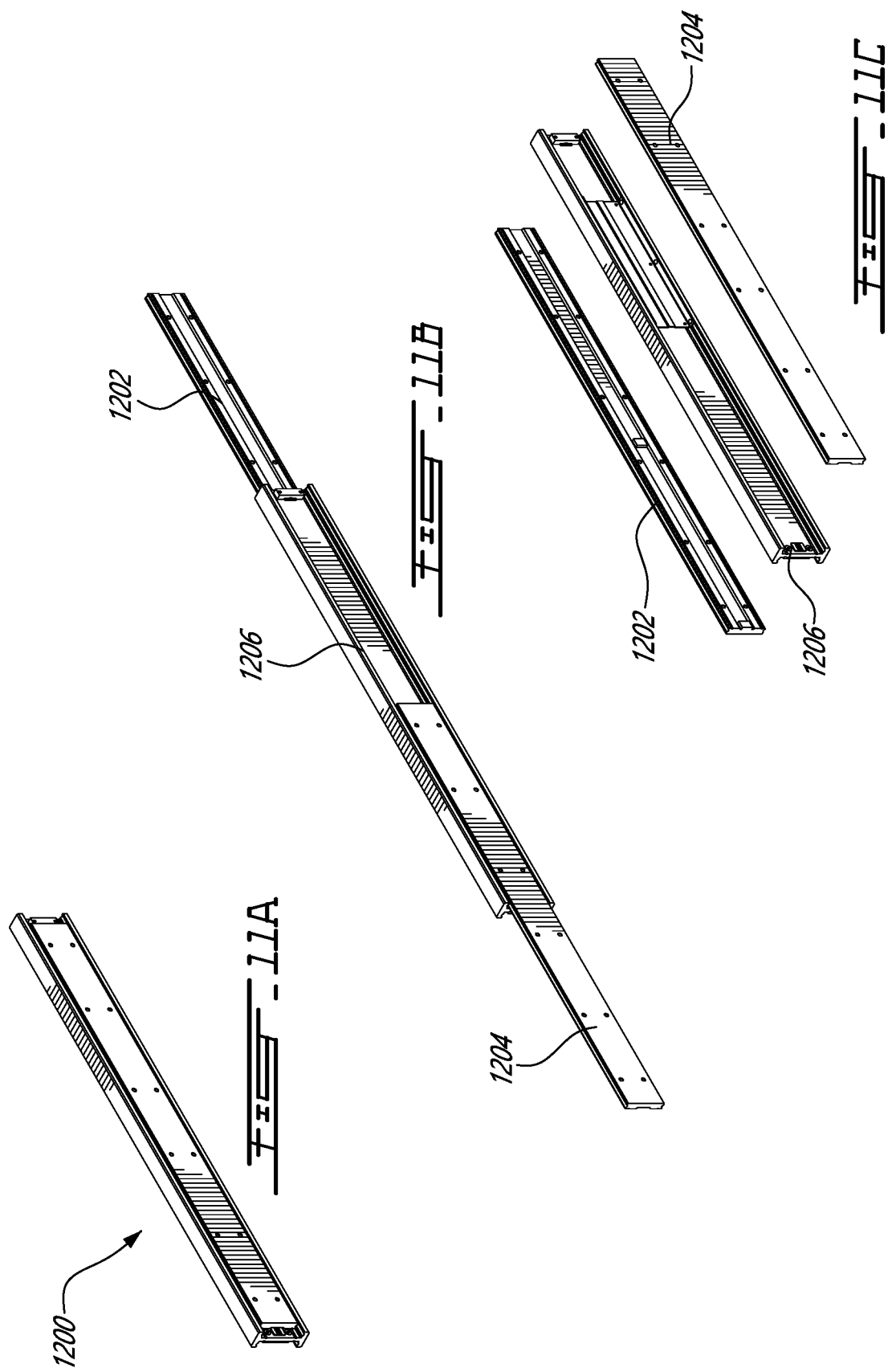
_FIG. 11A_
_FIG. 11B_
_FIG. 11C_

1202

1202

FULLY INTEGRATED QUANTUM COMPUTER

CROSS-REFERENCE TO RELATED APPLICATIONS

The present application claims the benefit of U.S. Provisional Patent Application No. 63/317,493 filed on Mar. 7, 2022, the contents of which are incorporated herein by reference in their entirety.

TECHNICAL FIELD

The present disclosure generally relates to the field of quantum computers and in particular, to housing structures for integrated quantum computers.

BACKGROUND

Quantum computers are machines that harness the properties of quantum states, such as superposition, interference, and entanglement, to perform computations. In a quantum computer, the basic unit of memory is a quantum bit, or qubit. Superconducting qubits are one of the most promising candidates for developing commercial quantum computers. Indeed, superconducting qubits can be fabricated using standard microfabrication techniques. Moreover, they operate in the few GHz bandwidth such that conventional microwave electronic technologies can be used to control qubits and readout the quantum states. However, superconducting qubits need to operate at temperatures close to absolute zero. This requires cryogenic refrigeration systems with multiple stages of cooling.

A quantum computer with enough qubits has a computational power inaccessible to a classical computer, which is referred to as "quantum advantage". Indeed, computational power increases with the number of qubits. While the quality of qubits has been an important technical challenge to the advancement of quantum computing, there are also many physical challenges associated with building a large-scale quantum computer. The control of multi-qubit systems requires the generation and coordination of a large number of electrical signals, with lots of cabling, a large cooling system, and many other components.

SUMMARY

In accordance with a first broad aspect, there is provided a quantum computer. The quantum computer comprises an outer frame defining an outer periphery that surrounds an interior volume, the outer frame having a top end, a bottom end, and a plurality of sides extending between the top end and the bottom end. A plurality of sub-frames are mounted to the outer frame within the outer periphery, the sub-frames disposed within the interior volume. Quantum hardware is mounted to the sub-frames, each of the sub-frames having a subset of the quantum hardware mounted thereto, the quantum hardware comprising cryostat components, gas handling components, control electronics components and servicing components.

The quantum computer as defined above and described herein may further include one or more of the following additional features, in whole or in part, in any combination.

In some embodiments, at least one of the sub-frames is displaceable relative to the outer frame.

In some embodiments, the at least one of the sub-frames is displaceable between an outer position and an inner position, wherein the at least one of the sub-frames is dis-posed within the outer periphery of the outer frame in the inner position and the at least one of the sub-frames at least partially extends beyond the outer periphery in the outer position.

In some embodiments, the at least one of the sub-frames is slidably mounted to the outer frame on rails.

In some embodiments, four of the sub-frames are mounted to the outer frame, each of the four sub-frames disposed within a quadrant of the outer frame.

In some embodiments, two of the four sub-frames are slidable into and out of the outer frame through a first one of the plurality of sides, and two others of the four sub-frames are slidable into and out of the outer frame through a second one of the plurality of sides opposite the first one of the plurality of sides.

In some embodiments, the subset of the quantum hardware in each of the sub-frames has a common functionality.

In some embodiments, the cryostat components are mounted in a first one of the subframes, the gas handling components are mounted in a second one of the sub-frames, the control electronics components are mounted in a third one of the sub-frames, and the servicing components are mounted in a fourth one of the sub-frames.

In some embodiments, the quantum computer further comprises panels covering the sides of the outer frame, the panels at least partially enclosing the sub-frames.

In some embodiments, the quantum computer further comprises a user interface mounted to the outer frame.

In some embodiments, the quantum computer further comprises quantum hardware mounts inside the sub-frames, the quantum hardware mounts configured for receiving and supporting the quantum hardware within the sub-frames.

In accordance with another broad aspect, there is provided a structure for housing a quantum computer. The structure comprises an outer frame composed of a plurality of first supporting members forming an outer sup-porting structure that is at least partially open, the outer supporting structure having a first top end, a first bottom end opposite to the first top end, and first sides extending between the first top end and the first bottom end, the outer supporting structure defining first side openings in the first sides. A plurality of sub-frames are disposed inside the outer frame, each of the sub-frames composed of a plurality of second supporting members forming an inner supporting structure that is at least partially open, the inner supporting structure having a second top end, a second bottom end opposite to the second top end, and second sides extending between the second top end and the second bottom end, the inner supporting structure defining second side openings in the second sides. Quantum hardware mounts are inside the sub-frames, the quantum hardware mounts configured for receiving and supporting quantum hardware for the quantum computer inside the sub-frames.

The structure for housing a quantum computer as defined above and described herein may further include one or more of the following additional features, in whole or in part, in any combination.

In some embodiments, the quantum hardware mounts comprise at least one panel extending between two supporting members of a given one of the sub-frames.

In some embodiments, the at least one panel is oriented parallel to the second top end and the second bottom end of the given one of the sub-frames.

In some embodiments, the at least one panel lies in a same plane as the second top end of the given one of the sub-frames, and is configured to suspend the quantum hardware inside the given one of the sub-frame.

In some embodiments, the at least one panel lies in a same plane as any one of the at least one sides of the given one of the sub-frames.

In some embodiments, each of the sub-frames is customized with the quantum hardware mounts according to a dedicated function of a subset of the quantum hardware to be received within a given one of the sub-frames.

In some embodiments, at least one of the sub-frames is dis-placeable relative to the outer frame, the at least one of the sub-frames is displaceable between an outer position and an inner position thereof, wherein the at least one of the sub-frames is dis-posed within the outer periphery of the outer frame in the inner position and the at least one of the sub-frames at least partially extends beyond the outer periphery in the outer position.

In some embodiments, two of the sub-frames are slidably mounted to the outer frame to slide in and out of the outer frame through a first one of the first side ends, and wherein two other ones of the sub-frames are slidably mounted to the outer frame to slide in and out of the outer frame through a second one of the first side ends opposite the first one of the first side ends.

In some embodiments, the quantum hardware mounts comprise cryostat component mounts, gas handling component mounts, control electronics component mounts, and servicing component mounts, and wherein the cryostat component mounts are mounted in a first one of the sub-frames, the gas handling component mounts are in a second one of the sub-frames, the control electronics component mounts are in a third one of the sub-frames, and the servicing component mounts are in a fourth one of the sub-frames.

Features of the systems, devices, and methods described herein may be used in various combinations, in accordance with the embodiments described herein.

BRIEF DESCRIPTION OF THE DRAWINGS

Reference is now made to the drawings, in which:

FIG. 2B is a top view of the outer frame of FIG. 2A;

FIGS. 11A-11C are an example of a rail assembly in different positions;

DETAILED DESCRIPTION

Figure 1A:
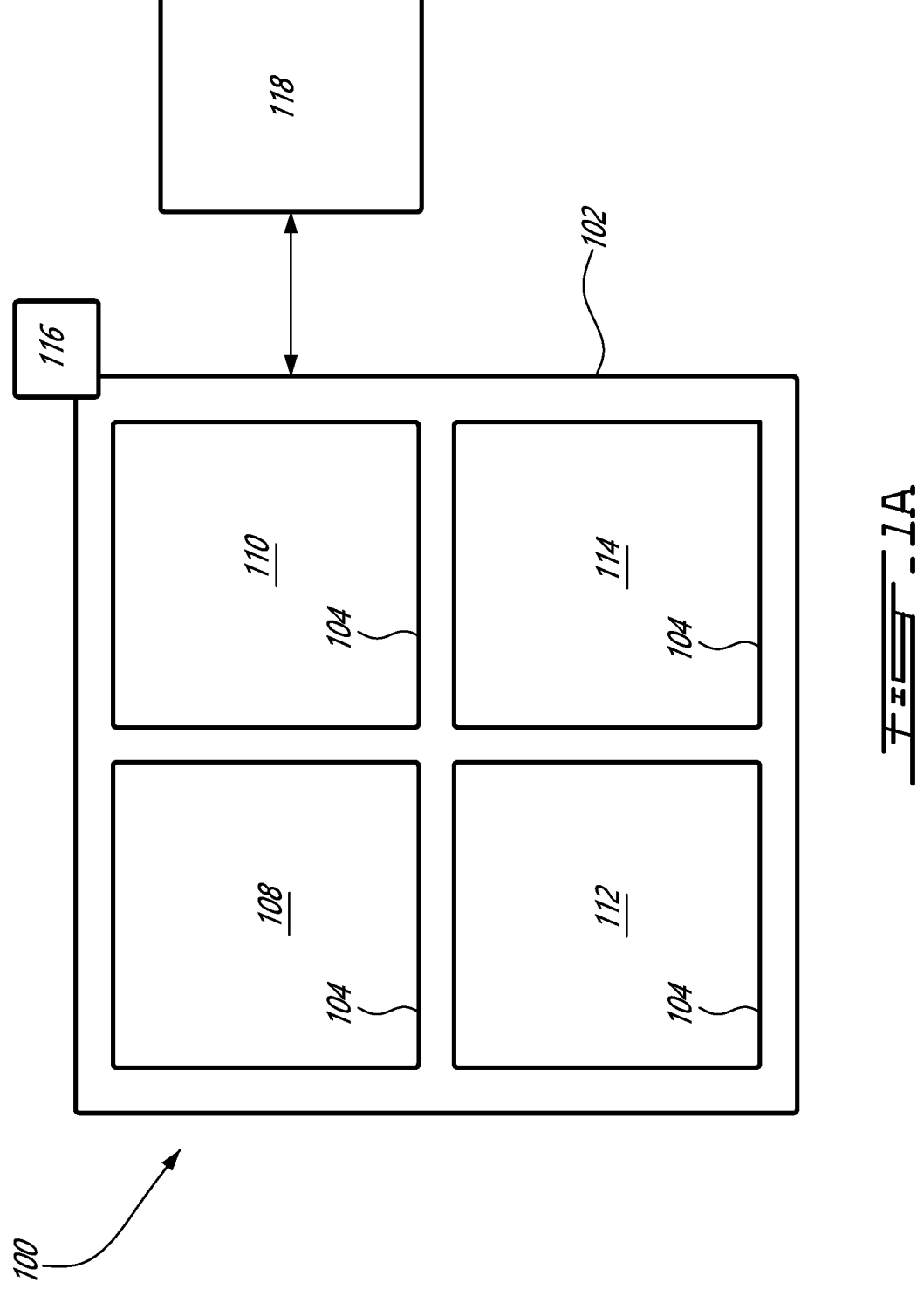
FIGS. 1A-1C are block diagrams of top views of a quantum computer in accordance with various embodiments.

The present disclosure is directed to a fully integrated quantum computer. With reference to FIG. 1A, there is illustrated a block diagram of a quantum computer 100 from a top view, in accordance with a first and non-limiting embodiment. The quantum computer 100 is provided at an installation site, for example in a data center, a warehouse, a factory, or any other industrial or commercial setting, and connected to dedicated peripheral equipment 118 such as pulse tube compressors, power supplies, isolation transformers, control cabinets, and the like. In some embodiments, the peripheral equipment 118 comprises a water supply for cooling of the quantum computer.

An outer frame 102 defines an outer periphery that surrounds an interior volume. A plurality of sub-frames 104 are disposed within the outer frame 102. The quantum computer 100 comprises quantum hardware mounted to the sub-frames 104. As used herein, quantum hardware refers to hardware components required to operate a quantum computer, including but not limited to any component or equipment used for gas handling, cryogenics, electronics, power, and servicing.

Together, the sub-frames 104 and the quantum hardware form modules inside the outer frame 102.

The sub-frames 104 are said to be modular in that each one may be customized with dedicated quantum hardware. In some embodiments, each module is customized with quantum hardware based on a given operational function of the quantum hardware, which can allow standalone testing (complete or partial) prior to final integration. In other words, each sub-frame 104 may regroup quantum hardware having a common functionality. In some embodiments, the modules can be built/manufactured and/or shipped/transported independently and integrated into the outer frame 102 at the installation site. In the example of FIG. 1A, the modules are a gas handling module 108, a cryostat module 110, a servicing module 112, and a control electronics module 114. A human machine interface 116 is provided to display system messages and/or provide inputs to the quantum computer 100. In some embodiments, the human machine interface 116 is a touchscreen. Other embodiments, such as a keypad and other input/output devices, may also be used.

Figure 1B:
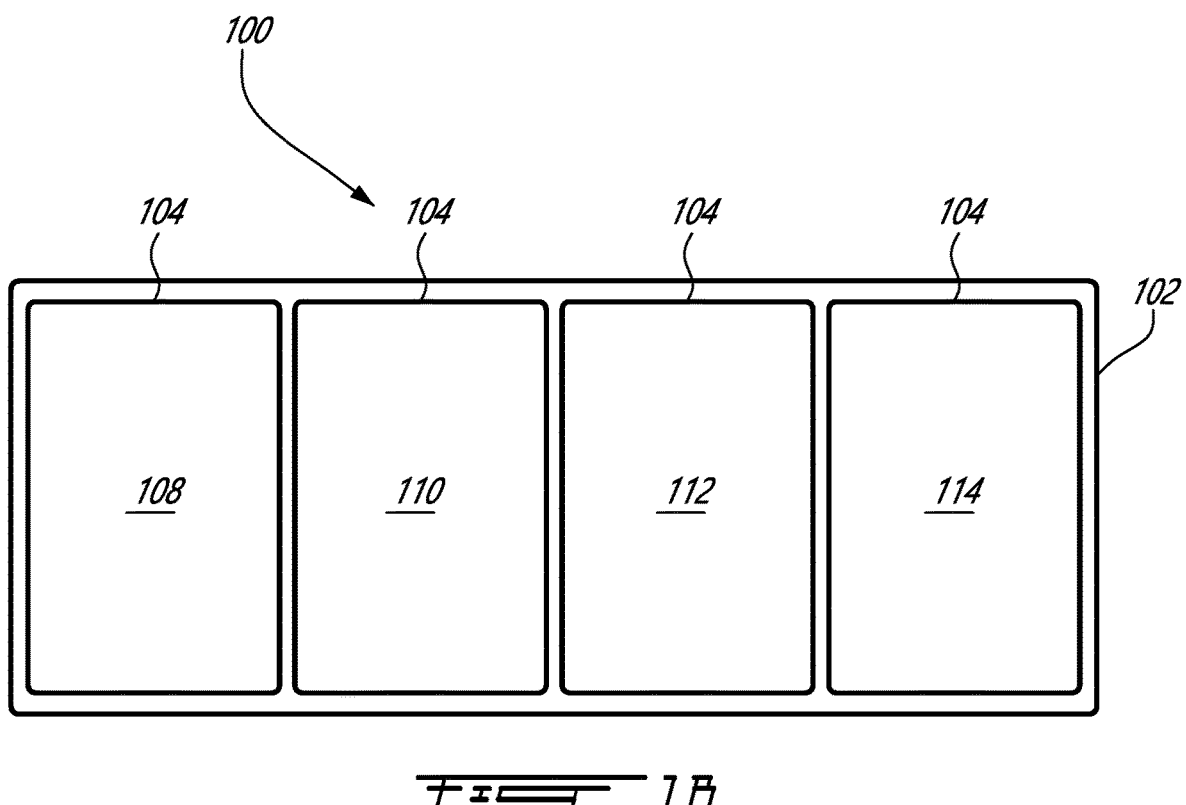
Figure 1C:
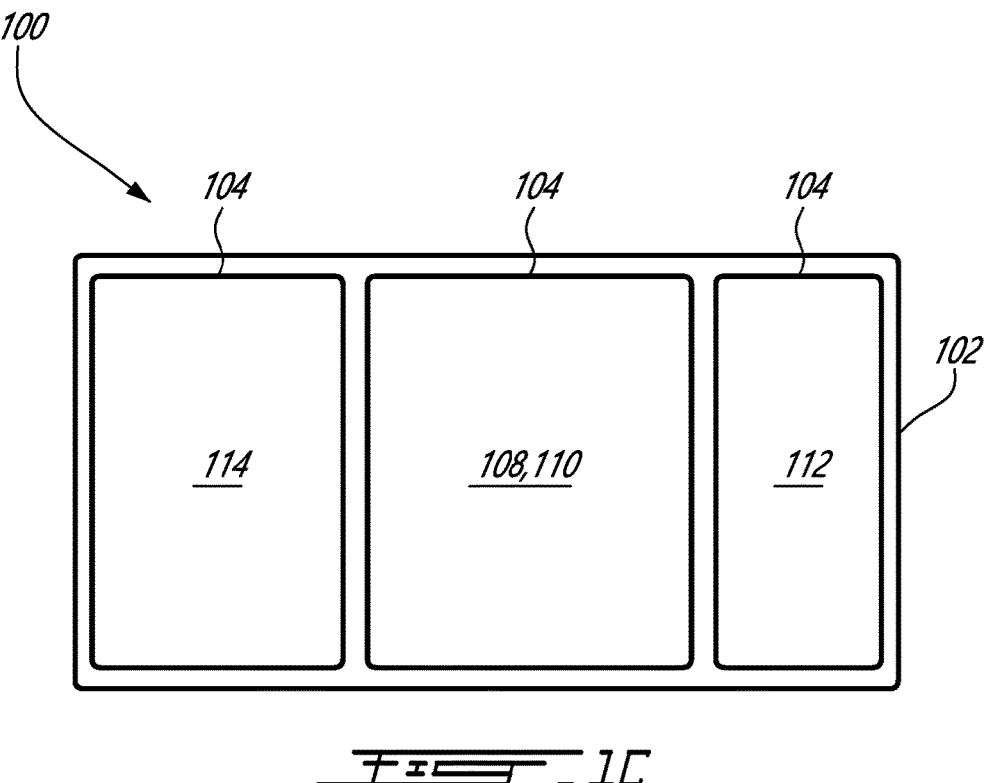

The outer frame 102 is illustrated as being cube-shaped but may take other forms, such as but not limited to a rectangular prism, a triangular prism, or a cylinder. In some embodiments, the sub-frames 104 are all the same shape and/or size, which may be dictated by the shape and/or size of the outer frame 102. In some embodiments, the sub-frames 104 are positioned as four quadrants of the outer frame 102, as shown in the example of FIG. 1A. Alternatively, the sub-frames 104 may be arranged sequentially, as shown in the example of FIG. 1B. Also alternatively, the subframes may be of varying shapes and/or sizes, as shown in the example of FIG. 1C. In this case, the gas handling module 108 and cryostat module 110 are consolidated in a same sub-frame 104. Alternatively, or in combination therewith, the control electronics module 114 and servicing module 112 may be consolidated in a same sub-frame 104. It will be understood that more or less subframes 104 may be used, as a function of the size and shape of the outer frame 102 and the disposition of the quantum hardware.

Figure 2A:
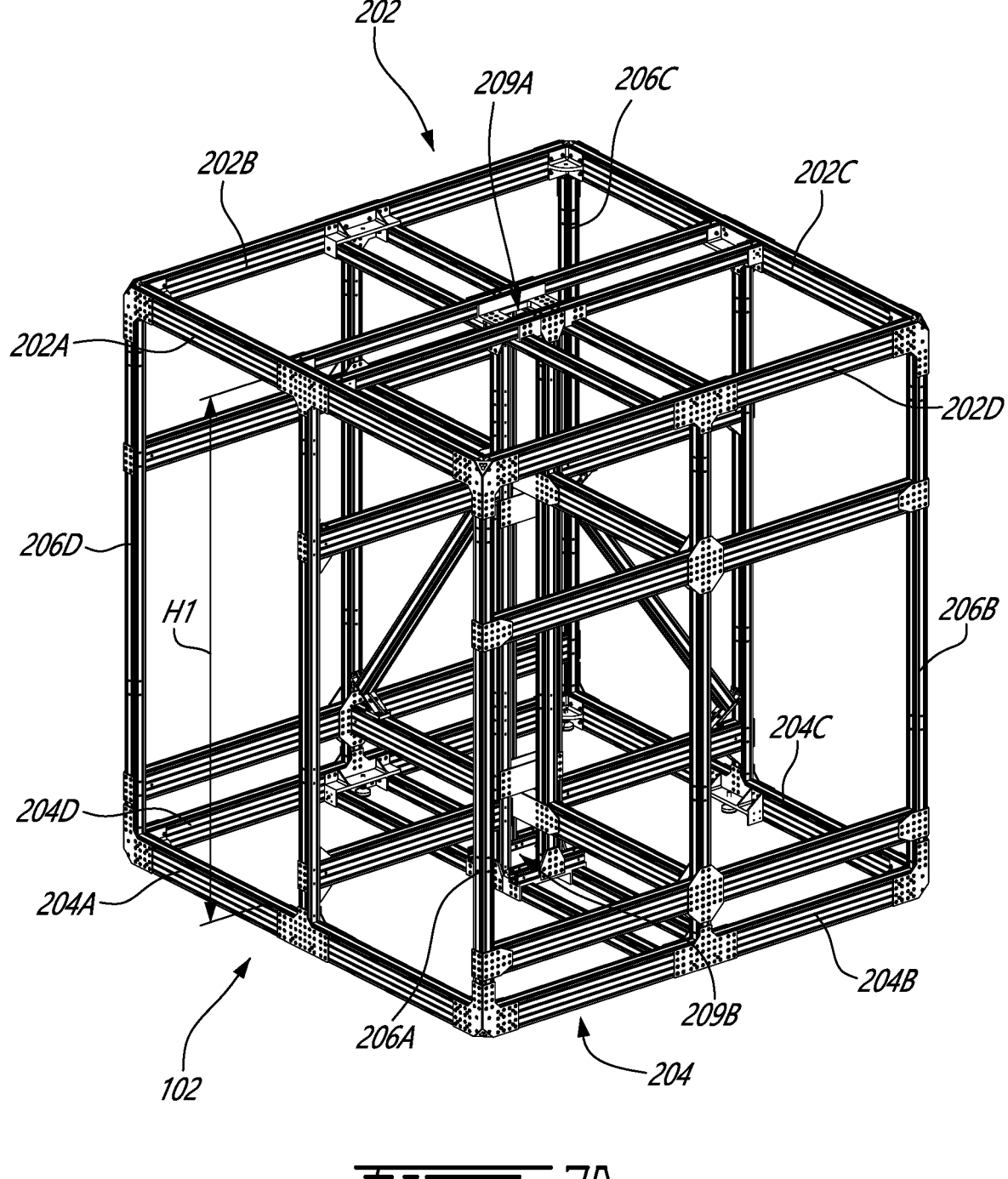
FIG. 2A is perspective view of an example outer frame of a quantum computer.

FIG. 2A illustrates an example embodiment of the outer frame 102 without any of the subframes or hardware components. A plurality of supporting members are arranged to form an outer supporting structure that is at least partially open. A top end 202 of the outer frame 102 is composed of upper supporting members 202A, 202B, 202C, 202D. A bottom end 204 of the outer frame 102 is composed of lower supporting members 204A, 204B, 204C, 204D. The top end 202 and bottom end 204 are joined together by a plurality of side supporting members 206A, 206B, 206C, 206D. The upper, lower, and side supporting members define side openings of the outer supporting structure. The outer frame 102 may be made of various materials, such as but not limited to extruded aluminum, steel, iron, and composite materials. In some embodiments, the various supporting members are bolted together using end brackets and/or support angles, for ease of assembling and/or dissembling. Alternatively, the supporting members are welded together. Other attachment techniques may also be used.

In some embodiments, the outer frame 102 comprises one or more additional supporting members for reinforcing the outer structure. For example, cross-shaped supporting members may be added, as shown in the example of FIG. 2B, which is a top view of the outer frame 102 showing top end 202. A cross-shaped supporting member 208 is provided between the upper supporting members 202A, 202B, 202C, 202D. The cross-shaped supporting member 208 may be formed integrally as a single piece or may be composed of multiple parts. In some embodiments, a central channel 209A is provided in the top end 202 of the outer frame 102, for example through the cross-shaped supporting member 208, to bring in cabling and/or water piping which is then distributed to the different modules. A similar channel 209B (shown in FIG. 2A) may also be provided in the bottom end 204 of the frame, to route cabling going between the different modules. Such cabling may be flexible and of sufficient length to allow the modules to slide in and out of the outer frame 102 without disconnecting the cables.

Figure 2C:
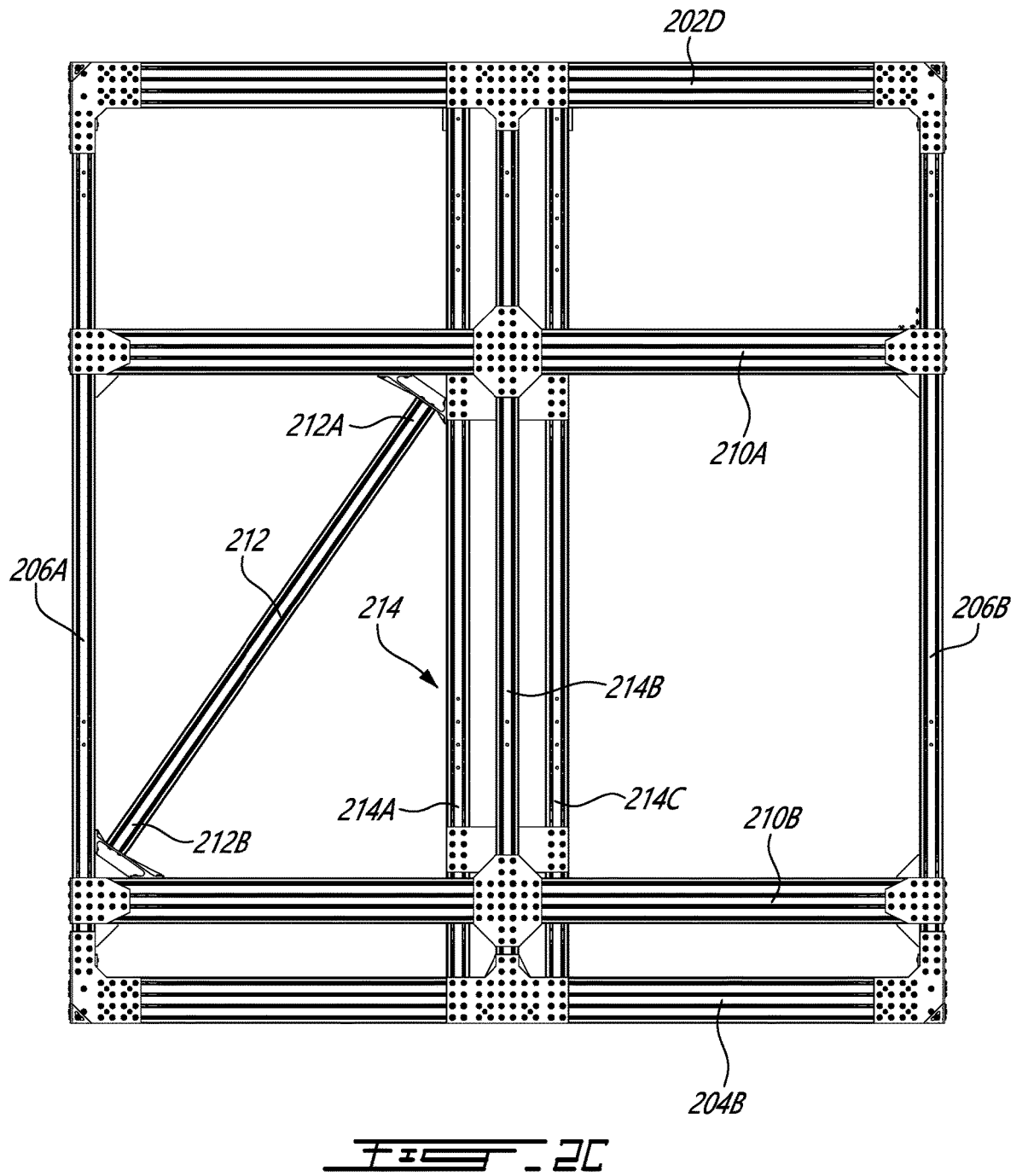
FIG. 2C is a side view of the outer frame of FIG. 2A.

In some embodiments, additional supporting members span horizontally or vertically across the outer frame 102. An example is shown in FIG. 2C, where a first supporting member 210A spans horizontally across a side of the outer frame 102, from side supporting member 206A to side supporting member 206B, proximate to and parallel with upper supporting member 202D. A second supporting member 210B also spans horizontally between side supporting members 206A, 206B, proximate to and parallel with lower supporting member 204B. The spacing between supporting members may vary, depending on whether the supporting members span a side of the outer frame through which a sub-frame is inserted. That is to say, for a side of the outer frame 102 that receives a sub-frame 104, the spacing between supporting members is set so as to allow insertion and removal of the sub-frame 104.

More than two additional supporting members may be provided in a given direction, i.e., between two supporting members of the outer structure 102. Similarly, a single additional supporting member may be provided between two supporting members of the outer structure 102, for example supporting member 214 spanning vertically between the upper supporting member 202D and the lower supporting member 204B. Supporting members may be formed from a plurality of parts, such as sub-parts 214A, 214B, 214C, or from a single part, such as supporting members 210A, 210B.

In some embodiments, additional supporting members are angled with respect to other supporting members forming the outer structure. Angled supporting members may be attached to more than one other structure. For example, supporting member 212 has a first end 212A attached to supporting members 210A, 214, and a second end 212B attached to supporting members 206A, 210B.

In some embodiments, supporting members act as rail supports, for example supporting members 210A, 210B. In such a case, the supporting members are positioned so as to correspond to a position of rail supports on a sub-frame 104, as will be described in more detail below. The rail supports may be made of a same or different material as the supporting members, such as extruded aluminum, steel, iron, and composite materials, and may be attached to the supporting members temporarily (e.g. bolted) or permanently (e.g. welded). Other arrangements for the supporting members will be readily understood in order to provide a desired stability and solidity to the outer frame 102.

Figure 3:
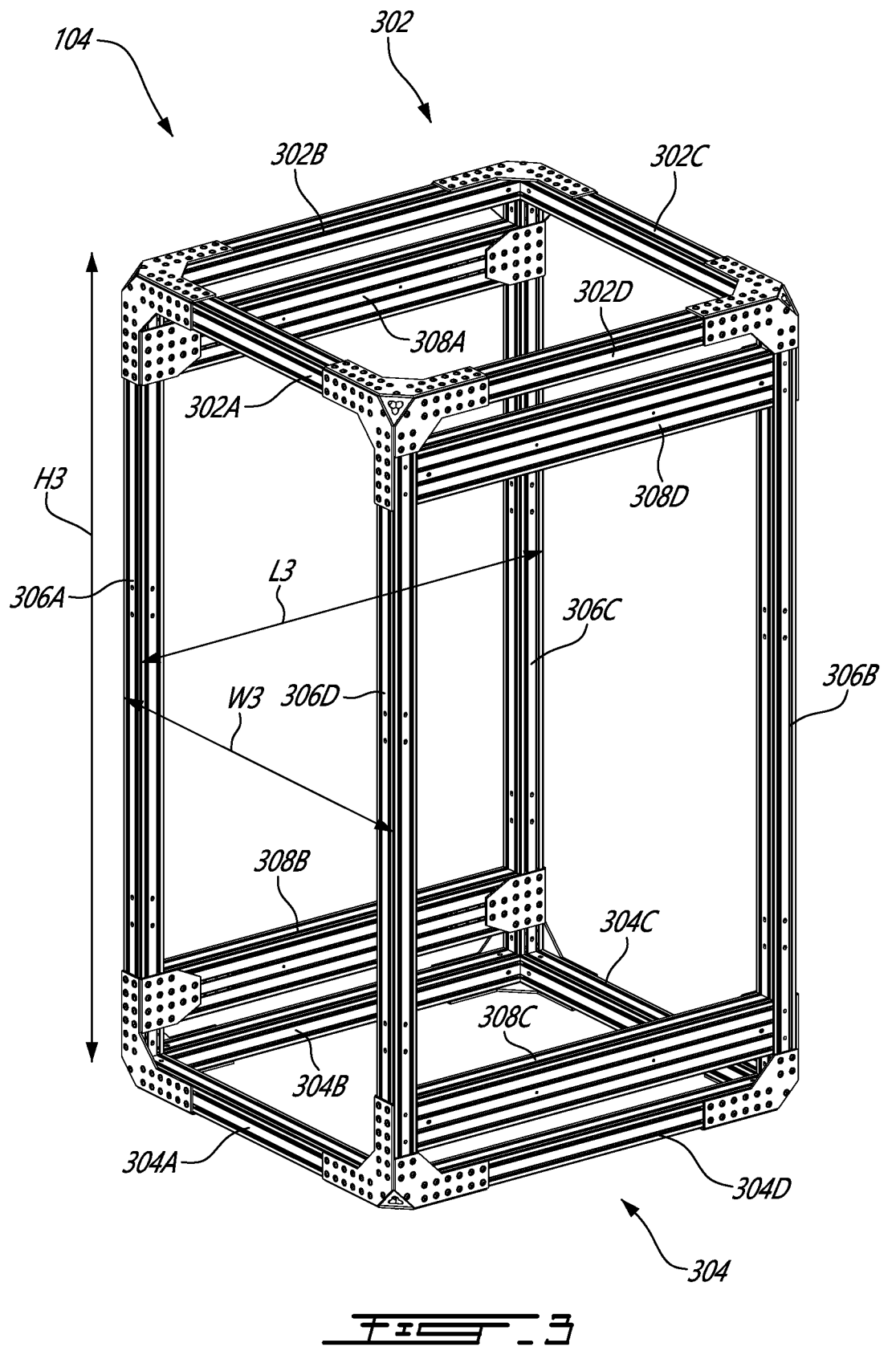
FIG. 3 is a perspective view of an example sub-frame of a quantum computer.

With reference to FIG. 3, there is illustrated an example embodiment of a sub-frame 104 without any quantum hardware mounted therein. A plurality of supporting members are arranged to form an inner supporting structure that is at least partially open. A top end 302 of the sub-frame 104 is composed of upper supporting members 302A, 302B, 302C, 302D. A bottom end 304 of the sub-frame 104 is composed of lower supporting members 304A, 304B, 304C, 304D. The top end 302 and bottom end 304 are joined together by a plurality of side supporting members 306A, 306B, 306C, 306D. The upper, lower, and side supporting members define side openings of the inner supporting structure.

In some embodiments, the sub-frames 104 may be inserted into the outer frame 102 through the side openings of the outer structure 102 and are therefore sized accordingly. That is to say, the height H3 of a sub-frame 104 is less than the height H1 (FIG. 2A) of the outer frame 102, the width W3 of the sub-frame 104 is less than the width W1 (FIG. 2B) of the outer frame 102, and the length (or depth) L3 of the sub-frame 104 is less than the length L1 (FIG. 2B) of the outer frame 102. In some embodiments, the sub-frames 104 are positioned inside the outer frame 102 as four quadrants, as shown in the example of FIG. 1A. In this case, the width W3 of the sub-frame 104 is less than the width W2 (FIG. 2B) of the outer frame 102, and the length L3 of the sub-frame 104 is less than the length L2 (FIG. 2B) of the outer frame 102, where W2 and L2 are approximately half of W1 and L1, respectively.

In some embodiments, the sub-frames 104 are configured to slide into the outer frame 102 using one or more sets of rails. Rails may be attached to the sub-frames 104 along one or more rail supports 308A, 308B, 308C, 308D, which span one or more sides formed between the top end 302 and the bottom end 304 of the sub-frame 104. The sub-frame 104 may be made of a same or different material as the outer frame 102, including but not limited to extruded aluminum, steel, iron, and composite material. Additional supporting members may also be added to the sub-frames 104, in a manner similar to that described above with respect to the outer frame 102.

Figure 4:
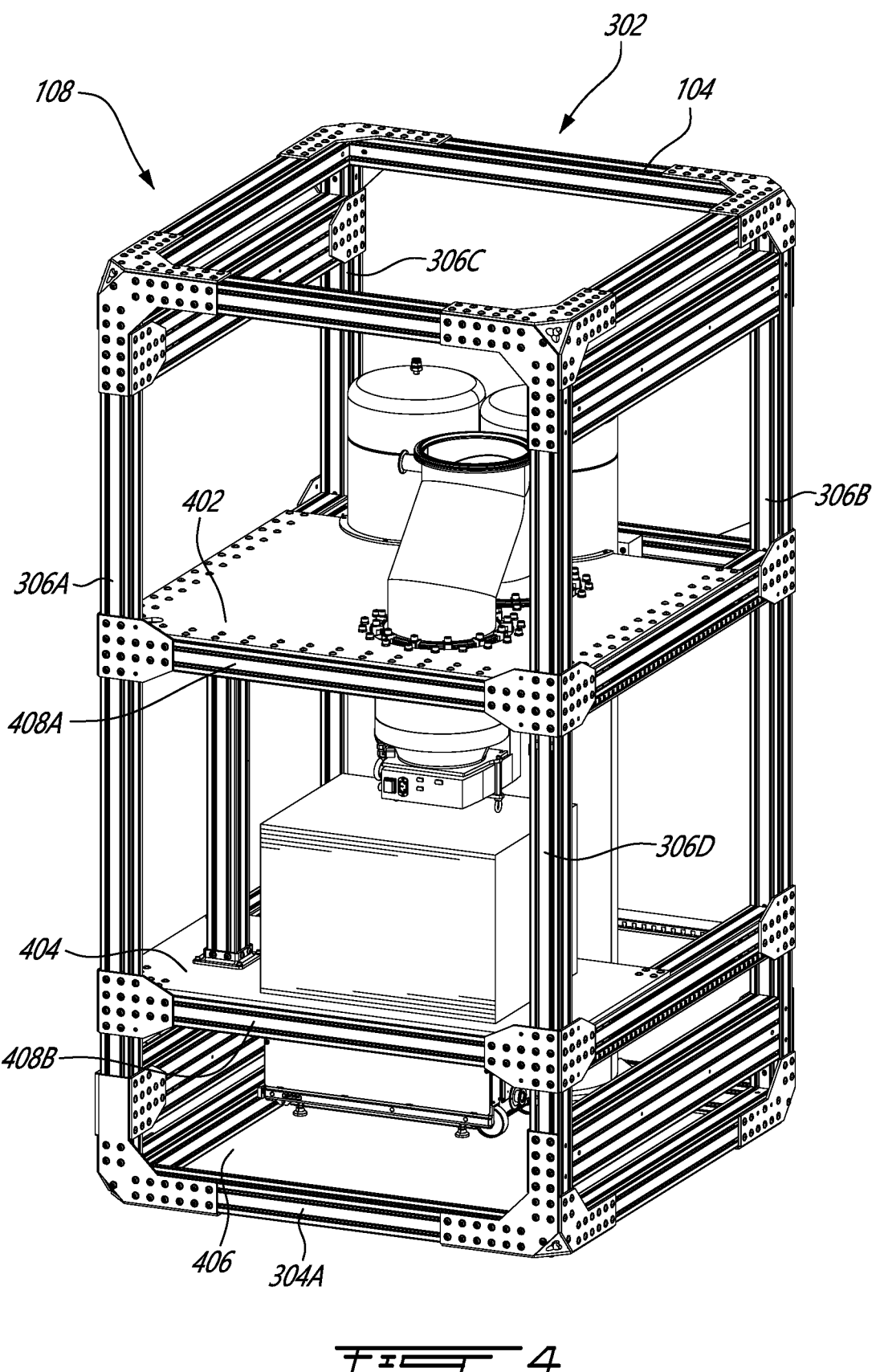
FIG. 4 is a perspective view of an example of gas handling components mounted inside the sub-frame of FIG. 3.

In some embodiments, quantum hardware mounts are provided inside the sub-frames. The quantum hardware mounts are configured for receiving and supporting the quantum hardware for the quantum computer inside the sub-frames 104. For example, the quantum hardware mounts may be plate-like panels that span part or all of a horizontal cross-section of the sub-frame 104 (i.e., parallel to the top end 302 and bottom end 304), and used to secure parts of the quantum hardware to the sub-frame 104. An example is illustrated in FIG. 4, which shows an embodiment of the gas handling module 108 with gas handling components mounted inside a sub-frame 104. The gas handling components may include pumps, valves, tanks, piping, cabling, and the like. The gas handling components are used to pump a Helium isotope mixture into a cryostat and provide proper cooling thereof. As shown, the various components making up the gas handling module 108, i.e. the gas handling components, are attached to the supporting members 306A, 306B, 306C, 306D through panels 402, 404, 406. In some embodiments, the panels 402, 404, 406 have cut-outs that allow the various components of the quantum hardware to extend therethrough. The quantum hardware mounts may be attached to one or more supporting member, for example panel 406 is attached to lower supporting member 304A (amongst others). In another example, panels 402, 404 are attached to supporting members 408A, 408B (amongst others), respectively. Cabling and/or piping and/or wiring connected to the gas handling module 108 may come through an opening of the sub-frame 104 at the top end 302, so as to bring cooling water and/or compressed air into the quantum computer 100. Alternatively, or in combination therewith, cabling and/or piping and/or wiring may come through any other opening of the sub-frame 104.

Figure 5:
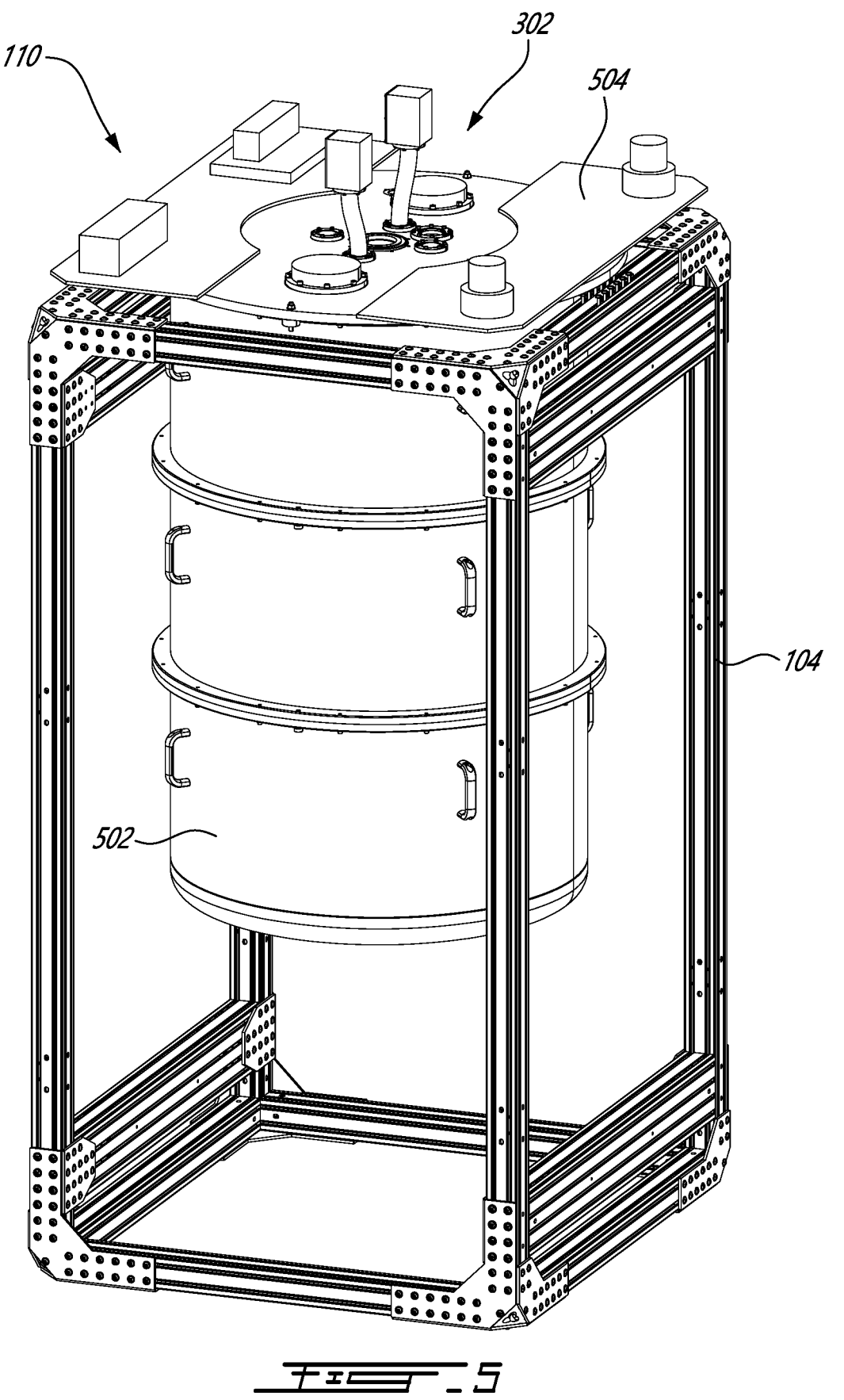
FIG. 5 is a perspective view of an example of cryostat components mounted inside the sub-frame of FIG. 3.

In some embodiments, some of the quantum hardware is suspended in the sub-frame 104 from quantum hardware mounts at its top end 302. An example is shown in FIG. 5, which shows an embodiment of the cryostat module 110 having cryostat components mounted inside a sub-frame 104. The cryostat module 110 comprises a cryostat 502, which consists of a vacuum enclosure with cold flanges that provide the environment needed to reach low temperatures for the operation of a quantum processor based on superconducting qubits. The cryostat 502 is suspended from a plate 504 to which other cryostat components may also be mounted, such as feedthrough connections for amplifiers, temperature sensors, heaters, pulse tube motors, pulse tube helium lines, and coaxial cables. The cryostat module 110 provides sufficient space around the cryostat 502 for assembling/disassembling the outer vacuum can within the sub-frame 104. The cryostat module 110 is connected to other modules of the quantum computer 100, such as the gas handling module 108 and the electronics module 114 through various cabling and/or piping and/or wiring coming in through the top end 302 of the sub-frame 104 or any other opening of the sub-frame 104.

Figure 6:
FIG. 6 is a perspective view of an example of control electronics components mounted inside the sub-frame of FIG. 3.

In some embodiments, the quantum hardware mounts comprise one or more cabinet inside the sub-frame 104, for storing quantum hardware. An example is illustrated in FIG. 6, which shows an embodiment of the control electronics module 114 with control electronics components mounted inside a sub-frame 104. The control electronics module 114 houses the control electronics components used to perform operations and measurements on the qubits inside the quantum processor housed in the cryostat 502. A first cabinet 602 houses various control electronics components, such as one or more server rack, one or more network switch, one or more computer server, and one or more circuit breaker. The size of the cabinet 602 may be determined based on the total number of qubits. In some embodiments, a second cabinet 604 is positioned adjacent to the first cabinet 602 and provides side cooling thereto. The cooling requirements for the first cabinet 602 may be determined based on the components found inside the first cabinet 602, their respective power consumption, the total power consumption, heat dissipation, and the air flow in and out of the first cabinet 602. Various cooling systems may be used inside the second cabinet 604. Alternatively, a cooling system is provided inside the first cabinet 602 and the second cabinet 604 is omitted. In another example, cold air may be brought in from outside the structure, for example as part of the dedicated peripheral equipment 118, to cool the control electronics components using fans and ducting.

Figure 7:
FIG. 7 is a perspective view of an example of servicing components mounted inside the sub-frame of FIG. 3.

In some embodiments, the quantum hardware mounts comprise plate-like panels disposed vertically inside the sub-frame 104. An example is illustrated in FIG. 7, which shows an embodiment of the service module 112 comprising servicing components mounted to a sub-frame 104. The servicing module 112 houses the power distribution system as well as the programmable logic controller (PLC) system elements, along with control, monitoring, and data acquisition systems for communication across different components within the quantum computer 100. In some embodiments, the servicing module 112 is configured as an electrical cabinet in which a technician may stand in order to troubleshoot the quantum computer 100. Side panels 702, 704 are disposed between pairs of supporting members along sides of the sub-frame 104, thus leaving the center area free. Various servicing components such as electrical breakers, terminal blocks, AC power, and the like are mounted to the first side panel 702. DC power and PLCs are mounted to the second side panel 704. In some embodiments, a third side panel may be provided with additional servicing components.

In some embodiments, the quantum hardware mounts comprise one or more rack inside the sub-frame 104. The rack may provide additional space for servicing components, such as network switches, temperature and/or pressure instrumentation, a maintenance server, a backup server, and the like. In the embodiment of FIG. 7, various servicing components are stored in a receptacle 706 suspended from the supporting members forming the top end 302 of the sub-frame 104. Alternatively, the receptacle 706 may be positioned elsewhere within the sub-frame 104.

When the quantum hardware mounts are provided inside the sub-frames 104, and the sub-frames are disposed inside the outer frame 102, the result is a structure for housing a quantum computer, ready to receive the quantum hardware components. In some embodiments, each of the sub-frames 104 of the structure is customized with the quantum hardware mounts according to a dedicated function.

Figure 8:
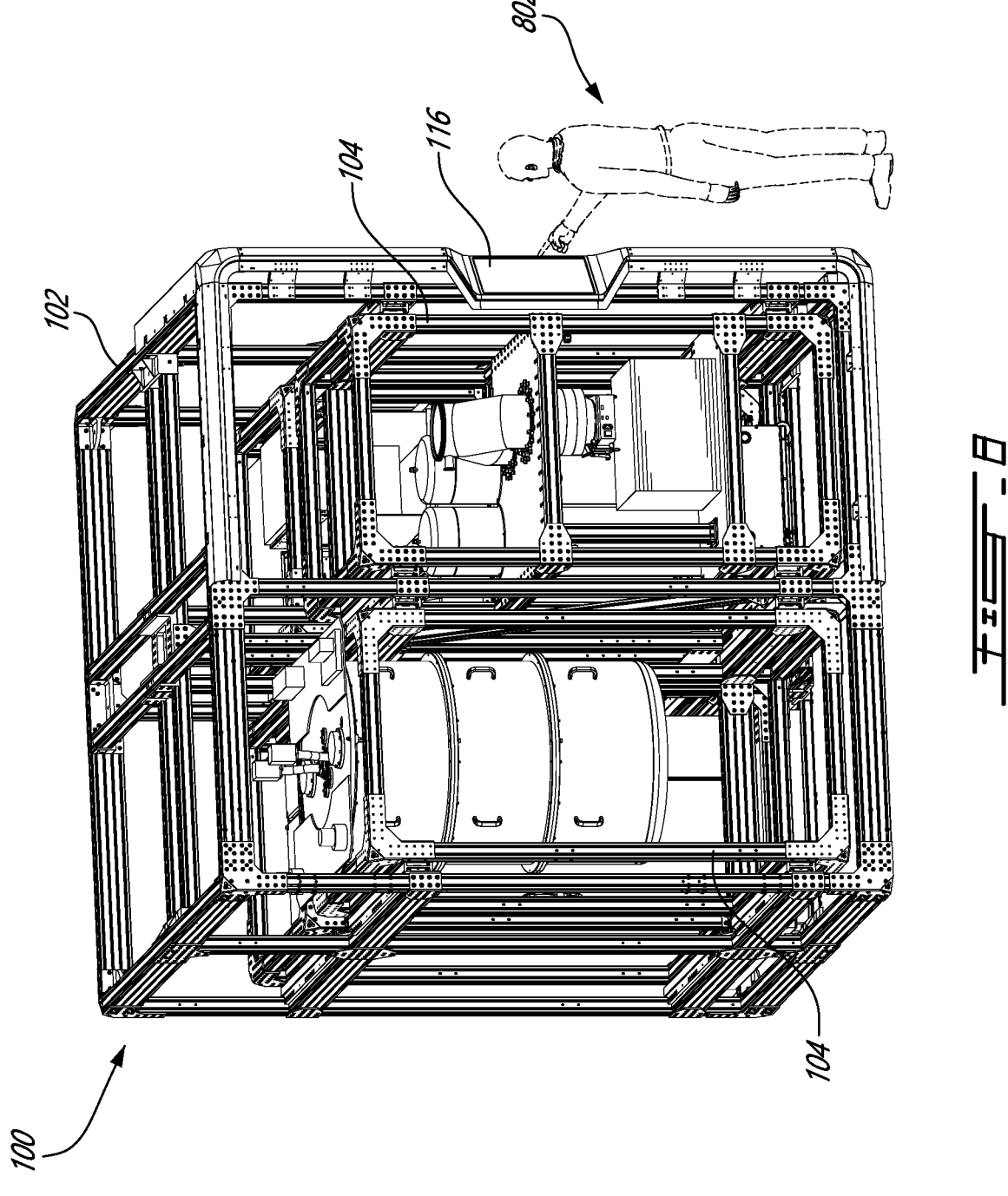
FIG. 8 is a perspective view of an example of a fully integrated quantum computer.

FIG. 8 shows an example embodiment of the quantum computer 100 with the modules positioned inside the outer frame 102. As shown, the modules are said to be in an inner position, such that the sub-frames 104 are disposed within the outer periphery of the outer frame 102. A user 802 is shown interacting with the human machine interface 116. In some embodiments, the human machine interface 116 is located on a corner edge of the outer frame 102, as shown. Alternatively, the human machine interface 116 may be provided at any other location of the quantum computer 100 or separately therefrom. For example, the human machine interface 116 may be separate from the outer frame 102 and communicate wirelessly with any of the quantum hardware components inside the quantum computer 100.

Figure 9:
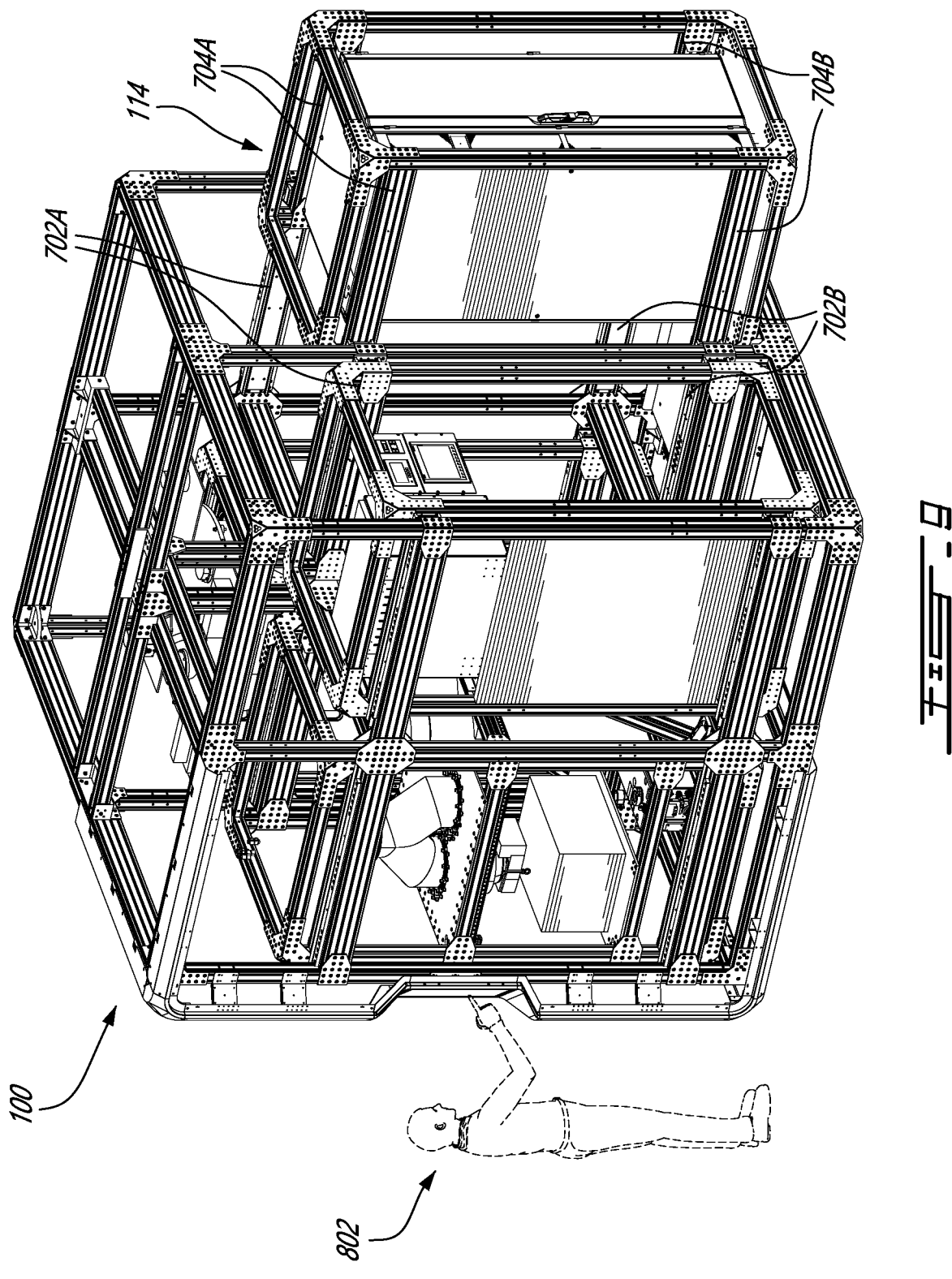
FIG. 9 is a perspective view of an example of a fully integrated quantum computer with a sub-frame in an outer position.

In some embodiments, one or more of the sub-frames 104 is displaceable relative to the outer frame 102. FIG. 9 shows the quantum computer 100 with the control electronics module 114 slid out from the outer frame 102. The control electronics module 114 is said to be in an outer position, such that the sub-frame 104 at least partially extends beyond the outer periphery of the outer frame 102. In some embodiments, the sub-frames 104 are slidably mounted to the outer frame 102 on rails. Upper rails 702A mounted to the outer frame 102 mate with upper rails 704A mounted to the sub-frame 104. Lower rails 702A mounted to the outer frame 102 mate with lower rails 704B mounted to the sub-frame. In some embodiments, a single set of rails may be provided on each of the inner frame 104 and the outer frame 102 to allow the inner frame 104 to slide in and out of the outer frame 102. In some embodiments, a mechanical locking mechanism may be provided to lock the sub-frames 104 in the stowed position. Sensor(s) and/or switch(es) may be used to confirm that the sub-frames 104 are stowed properly prior to powering of the equipment.

Figure 10A:
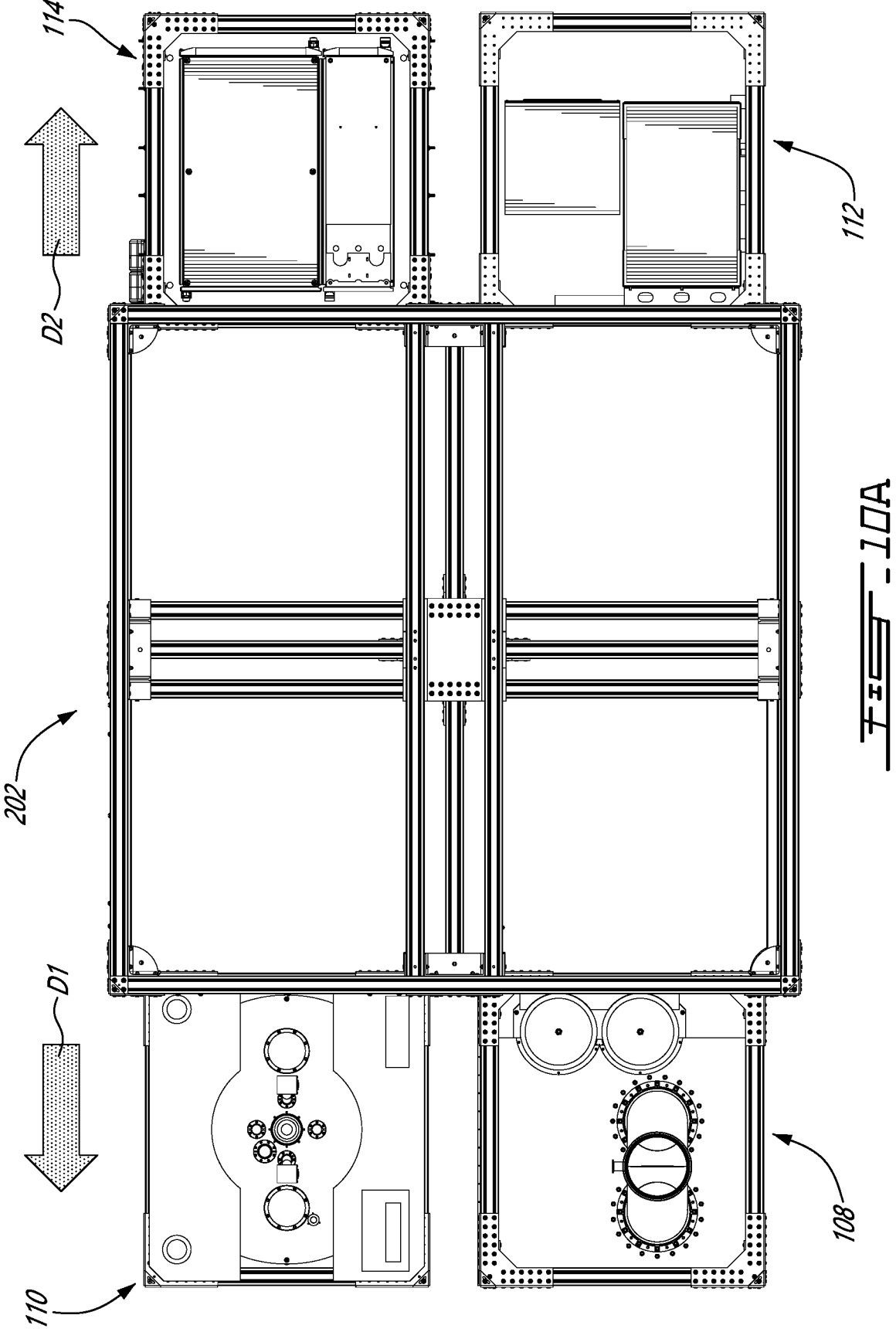
FIG. 10A is a top view of an example of a fully quantum computer with the modules in outer positions.
Figure 10B:
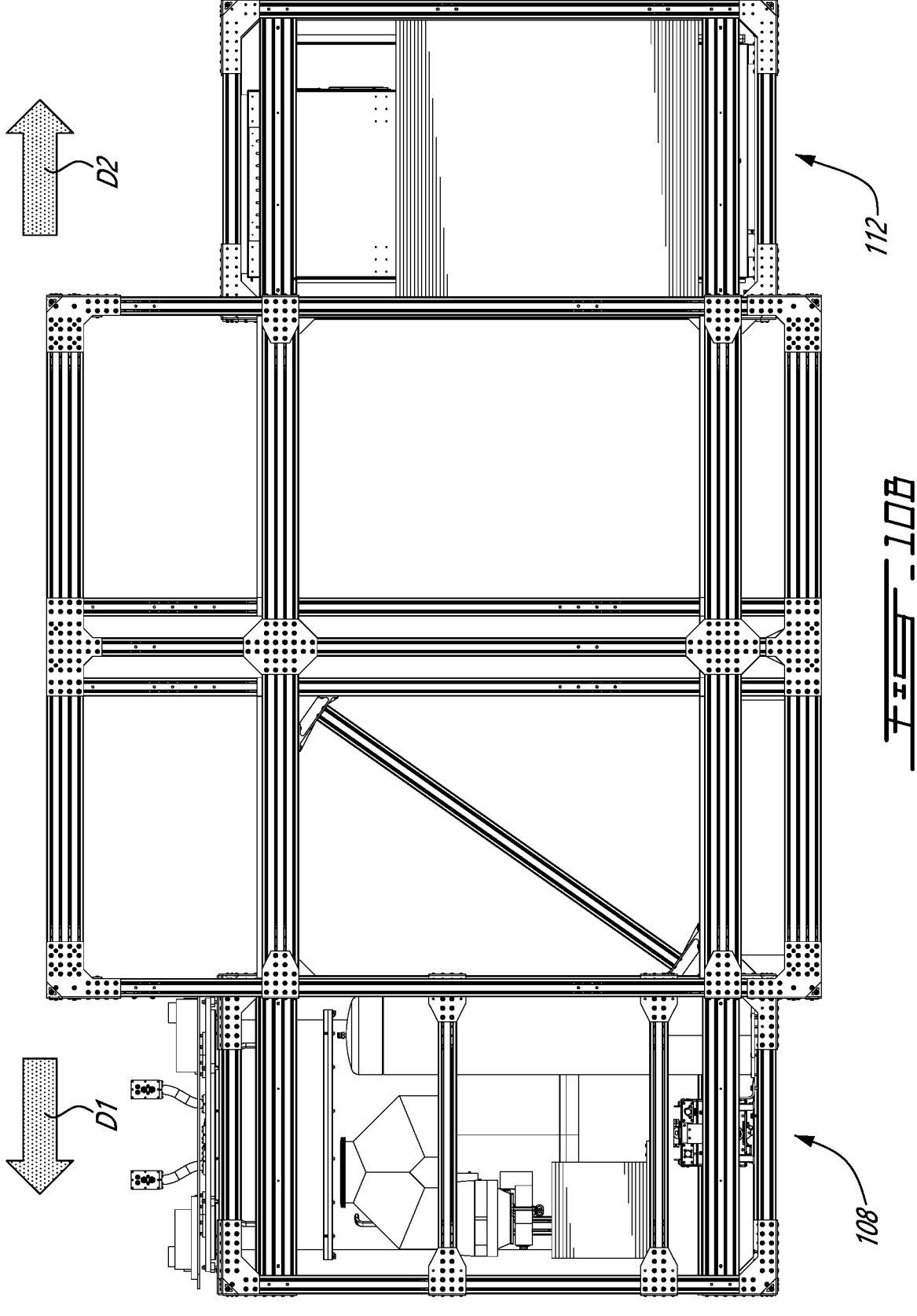
FIG. 10B is a side view of an example of a fully integrated quantum computer with the modules in outer positions.

The slide-out direction of each module may vary depending on practical implementation. With reference to FIGS. 10A and 10B, there is shown an embodiment where the cryostat module 110 and the gas handling module 108 are configured to slide out in a first direction D1, and the service module 112 and electronics module 114 are configured to slide out in a second direction D2 opposite the first direction D1. Together, the cryostat module 110 and the gas handling module 108 form the cryogenic system of the quantum computer 100. Many connections may be provided between modules 108, 110, making their close proximity and common entrance and exit side practical. Quantum hardware of the cryostat module 110 may be connected to quantum hardware of the gas handling module 108 using piping and/or wiring. The connections should be flexible and of a sufficient length to allow slide-out of either module 108, 110 one at a time without the need to disconnect the connections from either end. Other inter-module connections may also be present, for example the electronics module 114 may be connected to the cryostat module 110. Any cabling or wiring between interconnected modules that slide out from opposite sides should be sized accordingly. In some embodiments, each module may slide out in a different direction, i.e. from a different side of the quantum computer 100. Other embodiments for slide-out direction may also apply. In some embodiments, the human machine interface 116 is mounted to the outer frame 102 in a manner that makes it still accessible when one, or all, of the sub-frames 104 are in the outer position.

Figure 12:
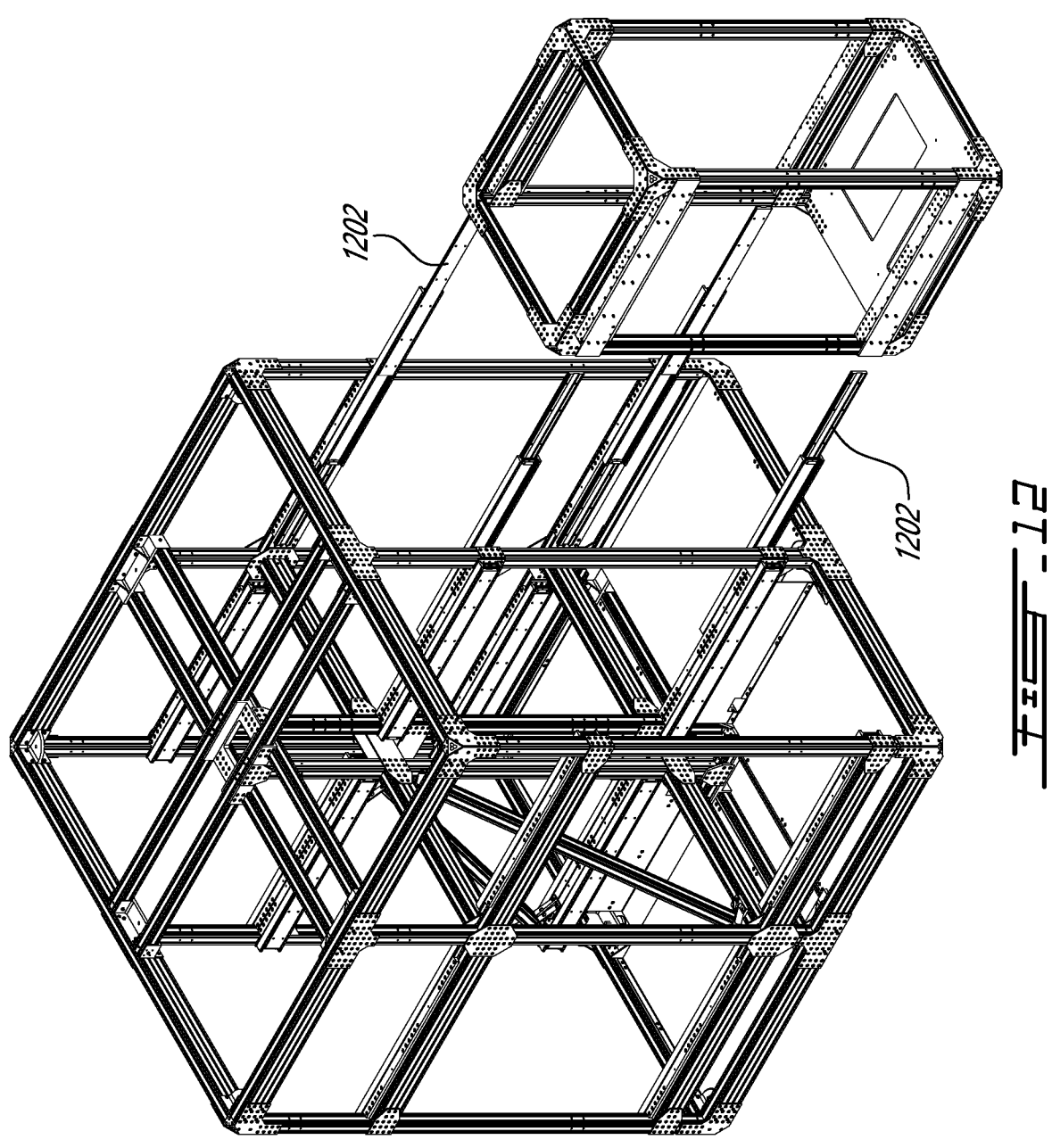
FIG. 12 is a perspective view of an example of a sub-frame aligned for insertion into an outer frame on a set of rails.

With reference to FIGS. 11A-11C, the sub-frames 104 may be slidably mounted inside the outer frame 102 using a rail assembly 1200. In some embodiments, the rail assembly comprises three components 1202, 1204, 1206 having relative motion, that extend telescopically to provide stability and range. A middle rail 1206 is coupled to an inner rail 1202 and an outer rail 1204. The inner and outer rails 1202, 1204 are slidably engaged in grooves on opposite sides of the middle rail. With additional reference to FIG. 12, four rail assemblies 1200 may be used. For each rail assembly 1200, the inner rail 1202 is attached to the sub-frame 104 and the outer rail 1204 is attached to the outer frame 102.

Figure 13:
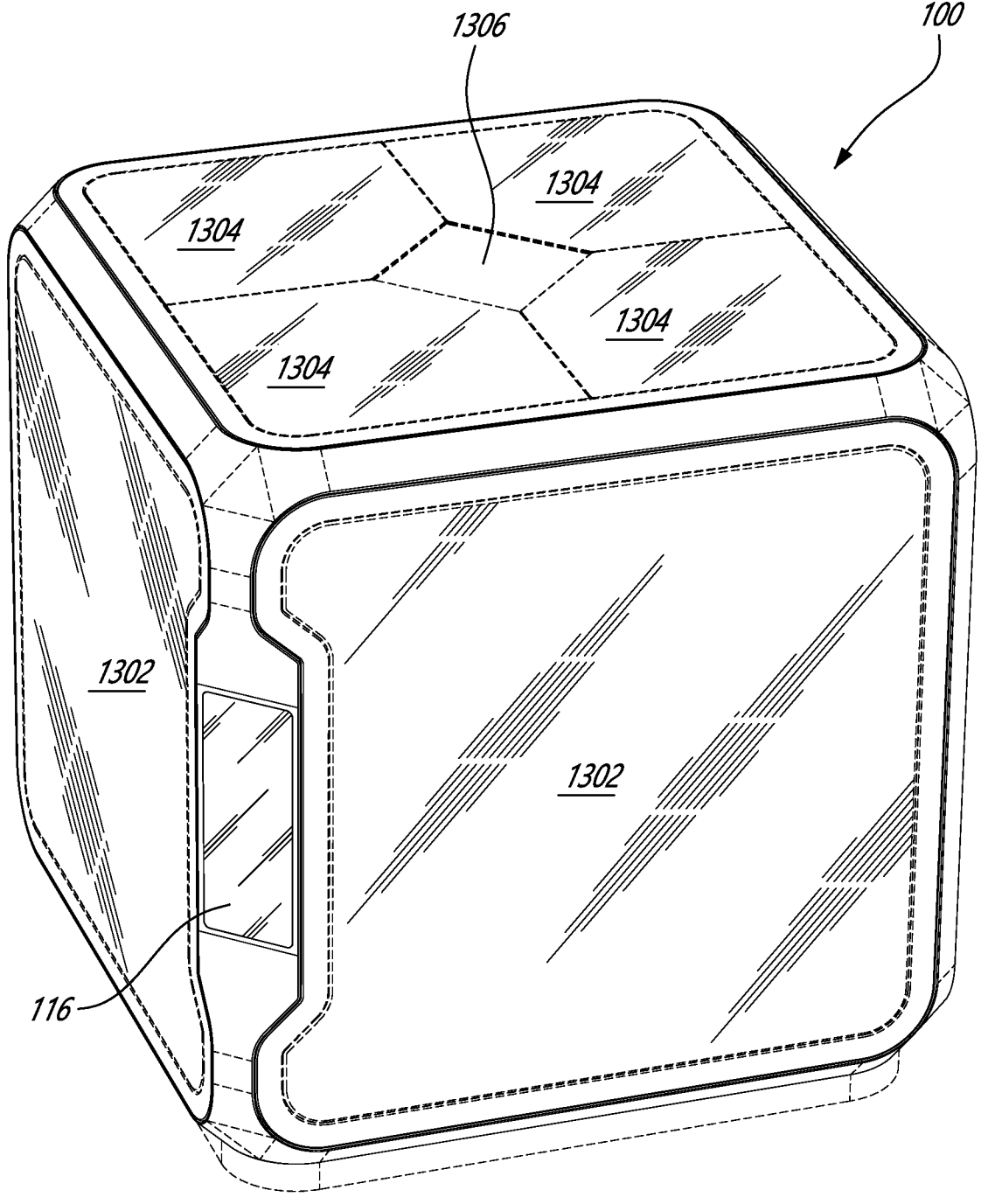
FIG. 13 is an example of a fully integrated quantum computer with exterior cladding.

In some embodiments, an exterior cladding may be provided around the outer frame 102 to cover the quantum hardware, an example of which is shown in FIG. 13. The exterior cladding may be removable to allow access inside the quantum computer 100, for example for servicing and/or upgrade. The human machine interface 116 may seamlessly blend with the exterior cladding. The exterior cladding may be composed of panels 1302, 1304. A single panel, such as panel 1302, may cover an entire side of the quantum computer 100. Multiple panels, such as panel 1304, may also be used for a same side of the quantum computer. In some embodiments, the panels 1304 define an opening 1306 through which wiring and/or cabling and/or piping may extend to connect with the quantum hardware. The panels 1302, 1304 may be made of various materials, such as but not limited to glass, plastic, and composites. In some embodiments, the panels 1302, 1304 are of controllable opacity so as to allow more or less of the inside of the quantum computer 100 to be visible from the outside. The opacity may be controllable via the human machine interface 116, for example. In some embodiments, the exterior cladding may be equipped with interlocks to detect unauthorized removal and/or tampering. Leveling pads may be provided underneath the quantum computer to compensate for an uneven floor level.

The quantum computer 100 as described herein allows for disassembly and reassembly of the structure at an end-user site. Each sub-frame 104 may be shipped independently with corresponding quantum hardware mounted therein, and assembled onsite. The exterior cladding is removable for ease of access inside, while providing an appealing aesthetic viewed from the outside. The design also allows for cable management for electrical power to be through an overhead waterfall, well above ground level, and higher that any cooling water lines.

The described embodiments and examples are illustrative and non-limiting. Practical implementation of the features may incorporate a combination of some or all of the aspects, and features described herein should not be taken as indications of future or existing product plans. Applicant partakes in both foundational and applied research, and in some cases, the features described are developed on an exploratory basis.

The term "connected" or "coupled to" may include both direct coupling (in which two elements that are coupled to each other contact each other) and indirect coupling (in which at least one additional element is located between the two elements).

Although the embodiments have been described in detail, it should be understood that various changes, substitutions and alterations can be made herein without departing from the scope. Moreover, the scope of the present disclosure is not intended to be limited to the particular embodiments of the process, machine, manufacture, composition of matter, means, methods and steps described in the specification.

As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

The invention claimed is:

1. A quantum computer comprising:
   an outer frame defining an outer periphery that surrounds an interior volume, the outer frame having a top end, a bottom end, and a plurality of sides extending between the top end and the bottom end;
   a plurality of sub-frames mounted to the outer frame within the outer periphery, the sub-frames disposed within the interior volume; and
   quantum hardware mounted to the sub-frames, each of the sub-frames having a subset of the quantum hardware mounted thereto, the quantum hardware comprising cryostat components, gas handling components, control electronics components and servicing components.

2. The quantum computer of claim 1, wherein at least one of the sub-frames is displaceable relative to the outer frame.

3. The quantum computer of claim 2, wherein the at least one of the sub-frames is displaceable between an outer position and an inner position, wherein the at least one of the sub-frames is disposed within the outer periphery of the outer frame in the inner position and the at least one of the sub-frames at least partially extends beyond the outer periphery in the outer position.

4. The quantum computer of claim 3, wherein the at least one of the sub-frames is slidably mounted to the outer frame on rails.

5. The quantum computer of claim 1, wherein four of the sub-frames are mounted to the outer frame, each of the four sub-frames disposed within a quadrant of the outer frame.

6. The quantum computer of claim 5, wherein two of the four sub-frames are slidable into and out of the outer frame through a first one of the plurality of sides, and two others of the four sub-frames are slidable into and out of the outer frame through a second one of the plurality of sides opposite the first one of the plurality of sides.

7. The quantum computer of claim 1, wherein the subset of the quantum hardware in each of the sub-frames has a common functionality.

8. The quantum computer of claim 7, wherein the cryostat components are mounted in a first one of the sub-frames, the gas handling components are mounted in a second one of the sub-frames, the control electronics components are mounted in a third one of the sub-frames, and the servicing components are mounted in a fourth one of the sub-frames.

9. The quantum computer of claim 1, further comprising panels covering the sides of the outer frame, the panels at least partially enclosing the sub-frames.

10. The quantum computer of claim 1, further comprising a user interface mounted to the outer frame.

11. The quantum computer of claim 1, further comprising quantum hardware mounts inside the sub-frames, the quantum hardware mounts configured for receiving and supporting the quantum hardware within the sub-frames.

12. A structure for housing a quantum computer, comprising:

an outer frame composed of a plurality of first supporting members forming an outer supporting structure that is at least partially open, the outer supporting structure having a first top end, a first bottom end opposite to the first top end, and first sides extending between the first top end and the first bottom end, the outer supporting structure defining first side openings in the first sides;

a plurality of sub-frames disposed inside the outer frame, each of the sub-frames composed of a plurality of second supporting members forming an inner supporting structure that is at least partially open, the inner supporting structure having a second top end, a second bottom end opposite to the second top end, and second sides extending between the second top end and the second bottom end, the inner supporting structure defining second side openings in the second sides; and quantum hardware mounts inside the sub-frames, the quantum hardware mounts configured for receiving and supporting quantum hardware for the quantum computer inside the sub-frames.

13. The structure of claim 12, wherein the quantum hardware mounts comprise at least one panel extending between two supporting members of a given one of the sub-frames.

14. The structure of claim 13, wherein the at least one panel is oriented parallel to the second top end and the second bottom end of the given one of the sub-frames.

15. The structure of claim 14, wherein the at least one panel lies in a same plane as the second top end of the given one of the sub-frames, and is configured to suspend the quantum hardware inside the given one of the sub-frame.

16. The structure of claim 13, wherein the at least one panel lies in a same plane as one of the second sides of the given one of the sub-frames.

17. The structure of claim 12, wherein each of the sub-frames is customized with the quantum hardware mounts according to a dedicated function of a subset of the quantum hardware to be received within a given one of the sub-frames.

18. The structure of claim 12, wherein at least one of the sub-frames is displaceable relative to the outer frame, the at least one of the sub-frames is displaceable between an outer position and an inner position thereof, wherein the at least one of the sub-frames is disposed within an outer periphery of the outer frame in the inner position and the at least one of the sub-frames at least partially extends beyond the outer periphery in the outer position.

19. The structure of claim 12, wherein two of the sub-frames are slidably mounted to the outer frame to slide in and out of the outer frame through a first one of the first sides, and wherein two other ones of the sub-frames are slidably mounted to the outer frame to slide in and out of the outer frame through a second one of the first side opposite the first one of the first sides.

20. The structure of claim 12, wherein the quantum hardware mounts comprise cryostat component mounts, gas handling component mounts, control electronics component mounts, and servicing component mounts, and wherein the cryostat component mounts are mounted in a first one of the sub-frames, the gas handling component mounts are in a second one of the sub-frames, the control electronics component mounts are in a third one of the sub-frames, and the servicing component mounts are in a fourth one of the sub-frames.

* * * * *